US011223320B2

(12) United States Patent
Vaidyanathan

(10) Patent No.: US 11,223,320 B2
(45) Date of Patent: Jan. 11, 2022

(54) SOLAR PANEL FLAT ROOF MOUNTING APPARATUS AND METHOD

(71) Applicant: Chandramouli Vaidyanathan, Eagan, MN (US)

(72) Inventor: Chandramouli Vaidyanathan, Eagan, MN (US)

(*) Notice: Subject to any disclaimer, the term of this patent is extended or adjusted under 35 U.S.C. 154(b) by 0 days.

(21) Appl. No.: 16/815,241

(22) Filed: Mar. 11, 2020

(65) Prior Publication Data

US 2020/0295700 A1    Sep. 17, 2020

Related U.S. Application Data

(60) Provisional application No. 62/817,057, filed on Mar. 12, 2019.

(51) Int. Cl.
| | |
|---|---|
| *H02S 20/24* | (2014.01) |
| *H02S 20/23* | (2014.01) |
| *H01L 31/042* | (2014.01) |
| *F24S 25/634* | (2018.01) |

(52) U.S. Cl.
CPC ............ *H02S 20/24* (2014.12); *F24S 25/634* (2018.05); *H01L 31/042* (2013.01); *H02S 20/23* (2014.12); *Y02B 10/10* (2013.01); *Y02E 10/50* (2013.01)

(58) Field of Classification Search
CPC ....... H01L 31/042; H02S 20/23; H02S 20/24; Y02E 10/47; Y02E 10/50; F24S 25/634; F24S 25/63; F24S 25/632; F24S 25/61; F24J 2/5203; F24J 2/5245; F24J 2/5252; F24J 2/5256
See application file for complete search history.

(56) References Cited

U.S. PATENT DOCUMENTS

| 8,826,608 | B2* | 9/2014 | Vaidyanathan | F24S 25/33 |
| | | | | 52/173.3 |
| 9,447,988 | B2* | 9/2016 | Stearns | E04D 13/00 |
| 2010/0206301 | A1* | 8/2010 | Aftanas | A61K 45/06 |
| | | | | 126/680 |
| 2010/0219304 | A1* | 9/2010 | Miros | F24S 25/636 |
| | | | | 248/125.8 |
| 2013/0104471 | A1* | 5/2013 | Kobayashi | F24S 25/632 |
| | | | | 52/173.3 |

(Continued)

FOREIGN PATENT DOCUMENTS

WO    WO-2011078227 A1 *  6/2011  ............. H02S 20/23

*Primary Examiner* — Jessie T Fonseca
(74) *Attorney, Agent, or Firm* — Billion & Armitage

(57) ABSTRACT

A roof-mounted solar energy apparatus including a mounting frame having a plurality of struts positioned in a first direction, the plurality of struts substantially parallel to one another, and a plurality of cross-member struts positioned in a second position that is substantially perpendicular to the plurality of struts positioned in the first direction. The plurality of struts attached to the crossmember struts. The apparatus also including a bracket having an end for engaging a strut or a cross-member strut and dimensioned to hold a solar panel. The solar panel or panels are held at an angle with respect to the flat roof or with respect to the struts. A method of forming a solar energy apparatus includes laying a plurality of struts in a first orientation, the plurality of struts being substantially parallel to one another, and attaching at least one crossmember to the plurality of struts to form a frame.

21 Claims, 11 Drawing Sheets

(56) References Cited

U.S. PATENT DOCUMENTS

| | | | |
|---|---|---|---|
| 2014/0090316 A1* | 4/2014 | Vaidyanathan | H02S 20/23 52/173.3 |
| 2014/0305887 A1* | 10/2014 | Zuritis | F24S 25/61 211/41.1 |
| 2017/0077866 A1* | 3/2017 | MacDonald | F24S 25/70 |
| 2017/0107723 A1* | 4/2017 | Stearns | E04D 1/30 |
| 2019/0280644 A1* | 9/2019 | Yamashita | H01L 31/042 |
| 2019/0341878 A1* | 11/2019 | Watson | H02S 20/10 |

\* cited by examiner

SOLAR PANEL FLAT ROOF MOUNTING APPARATUS AND METHOD

CROSS-REFERENCE TO RELATED APPLICATIONS

This application is claims priority under 35 U.S.C. § 119(e) to U.S. Provisional Patent Application No. 62/817,057, filed on 12 Mar. 2019, the contents of which are incorporated herein by reference in their entirety. A claim of priority is made.

BACKGROUND

Electrical power generation units, for example renewable energy systems such as solar photovoltaic systems, may be connected to an electrical utility grid or act as stand-alone power generation units and have become popular with home and business owners. It is common for customers to purchase solar photovoltaic systems for both purposes, such systems being most commonly installed on rooftops. Basic roof top solar photovoltaic systems involve one or more standardized solar panels which are attached to or integrated with mounting racks. Solar photovoltaic systems, including the solar photovoltaic panels, inverter, and mounting racks are designed and installed by providers, and typically must be customized for particular customers. The number of panels per system, electrical connections between individual panels, power-consuming devices, and the electric utility grid, zoning conditions, and installation site accessibility, among other factors, can significantly increase system prices.

Roof installation involves anchoring the system at a number of points throughout, requiring penetration at a number of anchor points. Each anchoring point 100, such as the one shown in FIG. 1, typically employs a lag bolt 101 or similar fastening element which penetrates all layers of the roof 110, which may include shingles, tar or felt paper, ice guard, the roof deck, flashing, and ridge caps, decreasing the sealing integrity of the roof. Anchoring point fasteners ideally, and often must, further penetrate roof rafters or trusses 111 for added strength against high winds and other elements, further increasing installation costs.

Further, roof construction, replacement, and overall life spans will not necessarily coincide with a solar photovoltaic system installation's lifespan, or a roof may become damaged by hail, falling trees or other like occurrences that will necessitate replacement or repair of the roof. In the event of such occurrences, roof-penetrating anchoring systems may need to be uninstalled and reinstalled a number of times, thereby detrimentally affecting overall system economics.

SUMMARY

Embodiments of the invention relate to roof-top mounting frames for solar photovoltaic systems which require minimal or no penetration for a substantially flat rooftop installation. The roof-mounted solar energy apparatus includes a mounting frame having a plurality of struts positioned in a first direction, the plurality of struts substantially parallel to one another. The frame also includes a plurality of cross-member struts or cross members positioned in a second position that is substantially perpendicular to the plurality of struts positioned in the first direction. The plurality of struts are attached to the crossmember struts. The apparatus also including a bracket or clip having an end for engaging a strut or a cross-member. The clip or bracket is dimensioned to hold a solar panel. The apparatus also includes a solar panel held by the plurality of brackets or clips, some of which are attached to the struts and some of which were attached to the cross members. In some embodiments, large frames are constructed that hold a multitude of solar panels. Such a large system is heavy so that ballast is not required within the perimeter of the system. Ballast may be provided on the outside edges or outside perimeter.

Solar photovoltaic systems which incorporate various embodiments of mounting frames described herein may further comprise one or more solar panels, an electrical power generation unit, a power inverter, and a power outlet, which may be connectible to energy storage units, electrically-powered devices, or an electric utility grid.

BRIEF DESCRIPTION OF THE DRAWINGS

The accompanying drawings illustrate non-limiting example embodiments of the invention.

DETAILED DESCRIPTION

Figure 1:
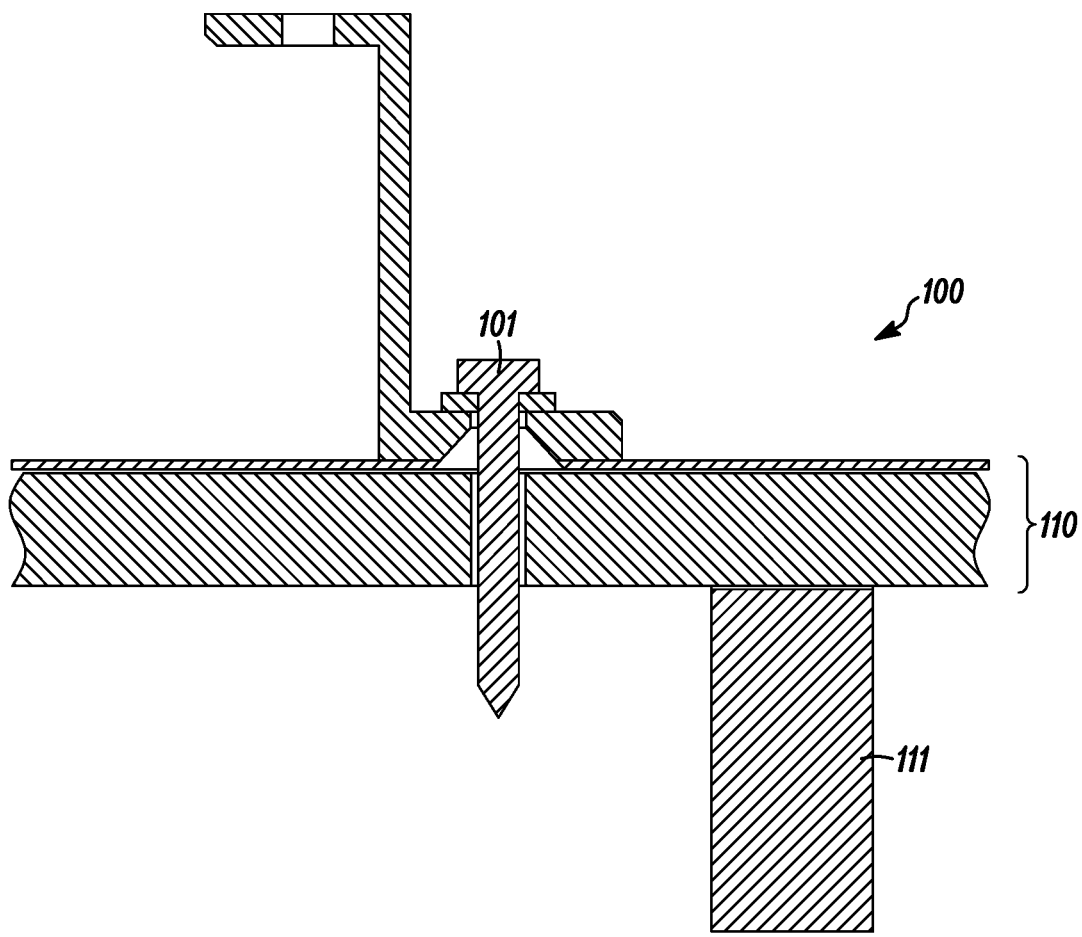
FIG. 1 is a cross-sectional side view of a roof-penetrating anchor, according to the prior art.

Embodiments of the invention relate to roof-top mounting frames which require minimal or no penetration for rooftop installation and are capable of accepting solar panels. Solar photovoltaic systems which incorporate various embodiments of mounting frames described herein may further comprise one or more solar panels, an electrical power generation unit, a power inverter, and a power outlet, which may be connectible to energy storage units, electrically-powered devices, or an electric utility grid. The mounting frames are generally laid out in a large grid on a flat or substantially flat roofed edifice or building. The large grid of solar panels is generally air permeable. In other words, wind can quickly pass through the frame and the attached solar panels so as to reduce wind loads. In other words, wind loads are quickly dissipated and do not build. Put another way, the pressure produced by a wind and the resulting forces produced by a wind are reduced and are also short lived. The grid of mounting frames, when assembled, is sufficiently heavy so that less ballast is needed, when compared to other systems. Concrete blocks are generally used as ballast. In a grid or frame of the instant system, the ballast blocks can be positioned beneath the solar panels so that the heat gain of the ballast blocks is reduced. The ballast blocks are in the shade. This is advantageous since there is less heat to contend with on the roof top after the sun sets. Still another advantage when compared to other systems is that a reduced number of ballast blocks are required in the instant system. This allows more solar panels to be placed on a flat roof for a given roof architected to hold a maximum load in addition to a wind load. This is even more of a consideration in climates that have snow and are designed with a snow load and a wind load in mind.

Throughout the following description, specific details are set forth in order to provide a more thorough understanding of the invention. However, the invention may be practiced without these particulars. In other instances, well known elements have not been shown or described in detail in order to avoid unnecessarily obscuring the invention. The drawings show, by way of illustration, specific embodiments in which the invention may be practiced. These embodiments may be combined, other elements may be utilized, or structural or logical changes may be made without departing from the scope of the invention. Accordingly, the specification and drawings are to be regarded in an illustrative, rather than a restrictive, sense.

All publications, patents and patent documents referred to in this document are incorporated by reference herein in their entirety, as though individually incorporated by reference. In the event of inconsistent usages between this document and those documents so incorporated by reference, the usage in the incorporated references should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more". In this document, the term "or" is used to refer to a nonexclusive or, such that "A, B or C" includes "A only", "B only", "C only", "A and B", "B and C", "A and C", and "A, B and C", unless otherwise indicated. The terms "above" and "below" are used to describe two different directions in relation to the center of a composite and the terms "upper" and "lower" may be used to describe two different surfaces of a composite. In the appended aspects or claims, the terms "first", "second" and "third", etc. are used merely as labels, and are not intended to impose numerical requirements on their objects.

The term "about" can refer to a variation of ±5%, ±10%, ±20%, or ±25% of the value specified. For example, "about 50" percent can in some embodiments carry a variation from 45 to 55 percent. For integer ranges, the term "about" can include one or two integers greater than and/or less than a recited integer at each end of the range.

Figure 2A:
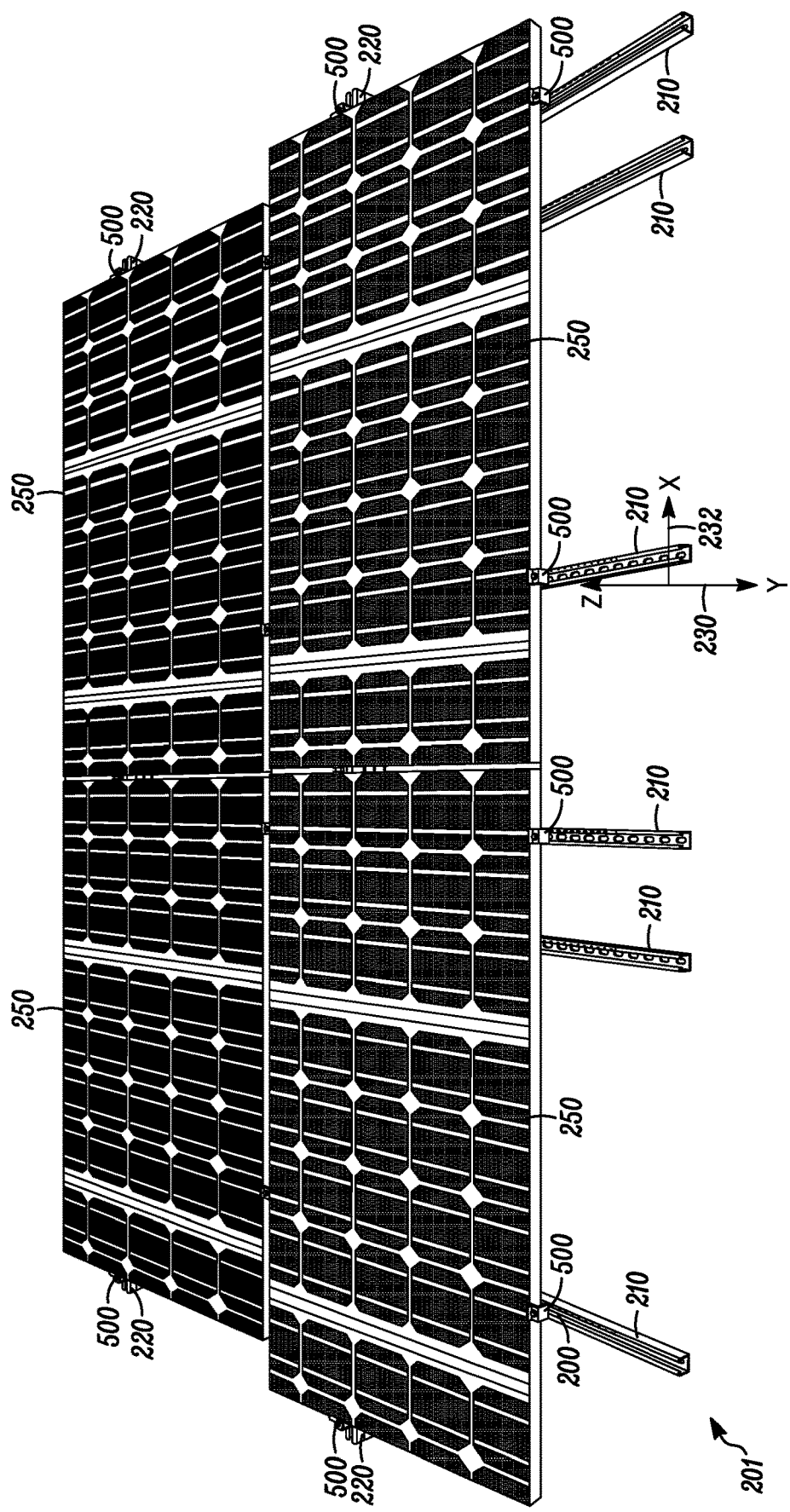
FIG. 2A is a top perspective views of mounting frame positioned on a flat roof, according to some embodiments.

FIG. 2A is a top perspective views of mounting frame 200 positioned on a flat roof 201, according to some embodiments. The mounting frame 200 has a plurality of struts 210 positioned in a first direction 230. The plurality of struts 210 are substantially parallel to one another. A plurality of cross-member struts 220 are positioned in a second direction 232, that is substantially perpendicular to the plurality of struts 210 positioned in the first direction. As shown in FIG. 2A, the first direction 230 is along an x-axis and the second direction 232 is along a y-axis. The plurality of struts 210 are attached to the crossmember struts. The mounting frame 200 apparatus also includes a bracket 500 or clip having an end for engaging a strut 210 or a cross-member 220 and dimensioned to hold a solar panel 250 or a plurality of solar panels 250. The apparatus also includes a solar panel 250 held by the plurality of brackets or clips 500, some of which are attached to the struts 210 and some of which were attached to the cross members 220.

Figure 2B:
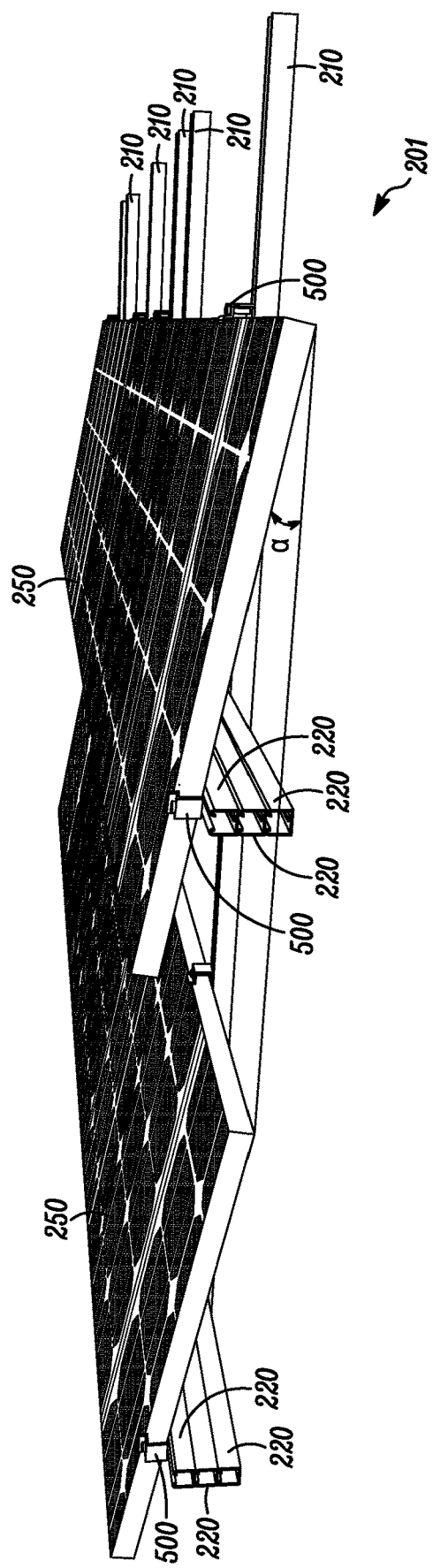
FIG. 2B is a side perspective view of a mounting frame positioned at a flat roof, according to some embodiments.

FIG. 2B is a side perspective view of a mounting frame 200 positioned at a flat roof 201, according to some embodiments. As more clearly shown in FIG. 2B, the crossmembers 220 are attached to the plurality of struts 210 so that the solar panel 250 forms an angle, $\alpha$, with respect to the plurality of struts 210 positioned in the first position. The plurality of struts 210 are positioned on the flat roof 201 so it can be said that the angle, $\alpha$, is formed between the solar panel 250 and the flat roof 201. In some embodiments, such as is shown in FIG. 2B, a stack of crossmembers 220 is attached to the plurality of struts 210, and the solar panel is attached to a stack of crossmembers to form an angle, $\alpha$, with respect to the plurality of struts 210 or the flat roof 201 on which the plurality of struts 210 are positioned. The angle, $\alpha$, between the solar panel 250 and the plurality of struts 210 is increased by increasing the number of crossmembers 220 in the stack of crossmembers. Similarly, the angle, $\alpha$, can be decreased by decreasing the number of crossmembers 220 in the stack of crossmembers. The angle, $\alpha$, is selected so that the attached solar panels 250 are positioned to receive more energy from the sun which can be converted to more electrical energy output from a solar collection apparatus that includes the solar panels 250 and the frame 200. Advantageously, the angle, $\alpha$, can be adjusted by varying the number of crossmembers 220 in the stack of crossmembers. Solar panels at the earth's equator would need no angle, $\alpha$. The farther the solar panel installation is from the equator, the higher the angle, $\alpha$. Furthermore, adjustments can be made seasonally to accommodate seasonal changes in the angle of declination of the sun. For example, the sun travels at higher angles for a portion of the year which would require less of an angle, $\alpha$, and travels at lower angles during other portions of the year which would require a higher an angle $\alpha$, to keep the solar panels pointed toward the sun. In North America, for example, the sun travels at higher angles during the summer months of the year which would require less of an angle $\alpha$, and travels at lower angles during the winter months of the year which would require a higher an angle $\alpha$, to keep the solar panels pointed toward the sun.

Figure 2C:
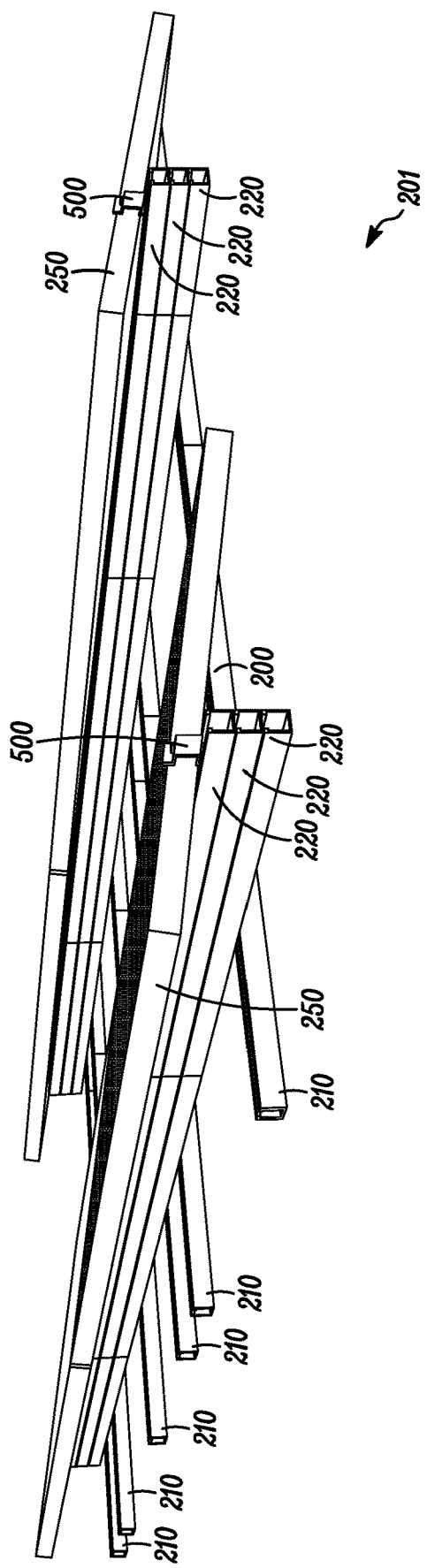
FIG. 2C is another side perspective view of a mounting frame positioned at a flat roof, according to some embodiments.

FIG. 2C is another side perspective view of a mounting frame 200 positioned at a flat roof 201, according to some embodiments. FIG. 2C shows that the crossmembers 220 in the stack of crossmembers 220 is continuous between the plurality of struts 210. In other words, the crossmembers 220 are continuous in that they are integral or unbroken. As shown in FIGS. 2A-2C, there is a stack of three crossmembers 220. It should be understood that the number of crossmembers 220 in the stack can be increased or decreased and is still considered part of the invention. The number of crossmembers 220 in each stack is just a different embodiment. It is also worthy to note that in some embodiments there may be more crossmembers in the stack than in other embodiments. Additionally, there may be only a single crossmember 220 in the "stack". There also may be instances where a frame includes a first number of crossmembers 220 in a first stack and a second or different number of crossmembers 220 and a second stack.

Figure 2D:
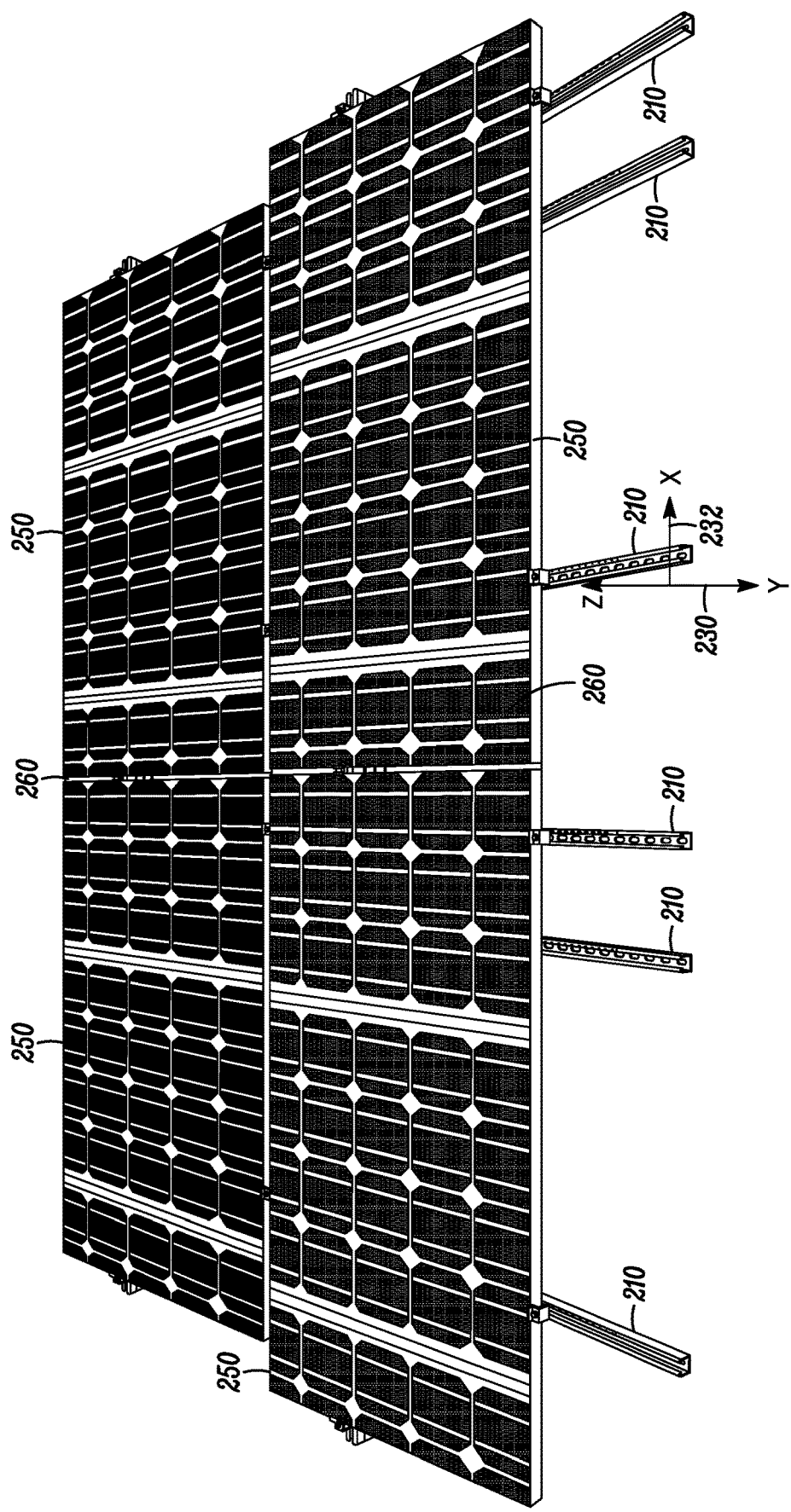
FIG. 2D is another top perspective view of mounting frame positioned on a flat roof, according to some embodiments.

FIG. 2D is another top perspective view of mounting frame 200 positioned on a flat roof 201, according to an example embodiment. As shown in FIG. 2D, four solar panels 250 are attached to the mounting frame 200. As mounted, there is a gap 260 between the solar panels 250. The gap accommodates changes in the dimensions as the solar panels heat up or cool down. The gap 260 is selected so that when the solar panels 250 are at or near a maximum temperature, they can grow into the gap 260 and will not interfere with one another. Without the gap 260, the solar panels could expand and interfere with one another and cause failure either at the connection points with the brackets or clips or along the edge of the solar panel 250 that corresponds to the gap 260 shown.

Figure 3:
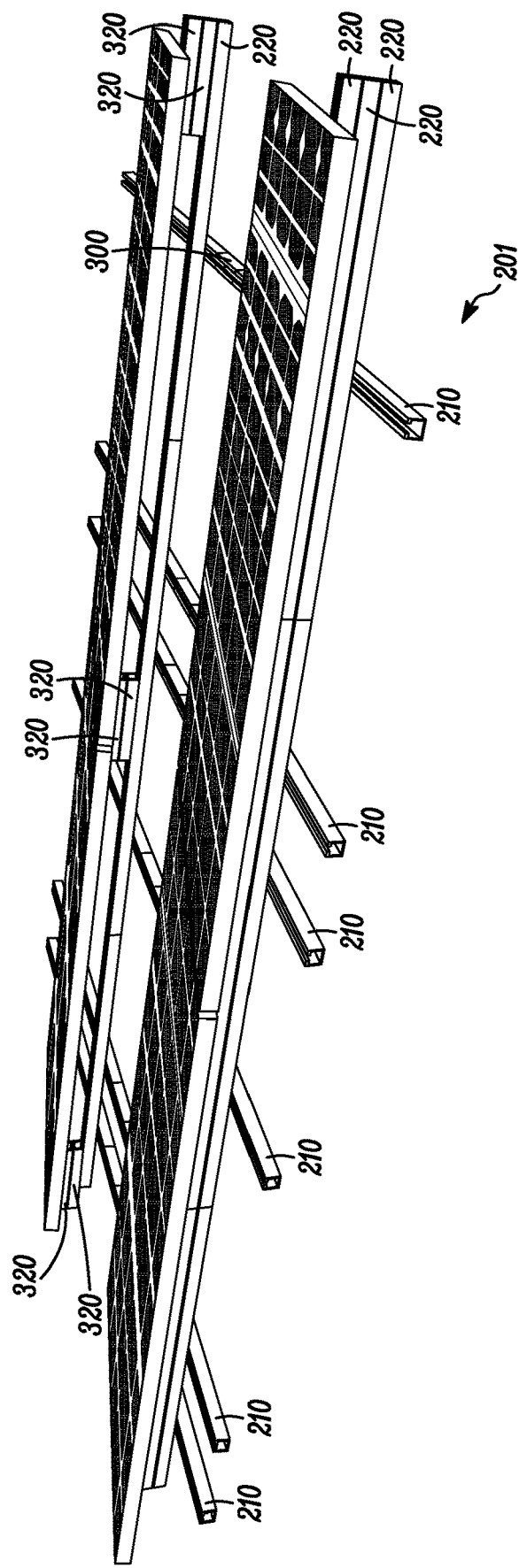
FIG. 3 is a rear perspective view of a mounting frame positioned on a flat roof, according to yet another embodiment.

FIG. 3 is a rear perspective view of a mounting frame 300 positioned on a flat roof 201, according to yet another example embodiment. The back or rear of the frame 300 has crossmembers 220 which are continuous. This forms a wall or windbreak to prevent wind from getting under the solar panels 250 and lifting the frame 300. Generally, the frame 300 or 200 is quite heavy. The frame 300 is lightened somewhat by employing discontinuous crossmembers 320 toward the front of the frame. As shown, and integral or continuous crossmember 220 is attached to the struts 210. The stacks are formed with shortened lengths of crossmembers 320. This provides for a lighter frame 300 when compared to frame 200. This also reduces the cost of materials for the frame 300. The shortened length crossmembers 320 are added to a stack to keep the angle, α, substantially the same. The embodiments shown in FIGS. 2A, 2B, 2C, 2D and 3, the crossmembers 220, 320 and the struts 210 have three continuous sides and a pair lips or catches on the fourth side. This strut design is advantageous in that T bolts can be used to attach various elements to the struts. This will be further detailed in FIG. 5 below.

The mounting frames previously disclosed may be incorporated with other components to provide a roof-mountable solar photovoltaic power system. Such systems may comprise one or more solar photovoltaic panels 400 capable of generating electrical power, a power inverter 410 and a power outlet, as depicted schematically in FIGS. 4A, 4B, and 4C. The power inverter 410 may comprise a power source meter and switch, capable of converting DC power to AC power. In some embodiments the system is capable of outputting DC power, AC power, or both DC and AC power. In some embodiments the system may comprise a quick-connection point for supplying power. Power may be supplied to electrically powered devices, the power grid 440, or external energy storage units 430. In some embodiments the system includes an internal energy storage system, such as a rechargeable battery, a flywheel, a closed cycle fuel cell, or combinations thereof. The energy storage units may deliver power at a controlled or required rate and may additionally simultaneously store energy.

In some embodiments the system may comprise one or more snow removing, wiping, and cleaning devices, which may be operated or powered by battery, hand-crank, wind turbine, or other suitable means. Examples of such snow removal devices can be found in co-owned U.S. Patent Application 20110308574 A1 titled "SOLAR POWERED ELECTRICAL GENERATION DEVICE AND RELATED METHODS", the disclosure of which is herein incorporated by reference. Such optional snow removing devices 450 are shown in FIGS. 4A-C.

Figure 4A:
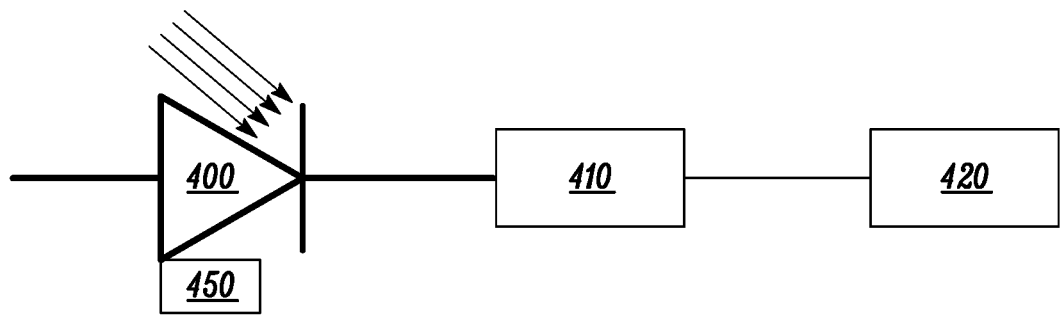
FIG. 4A is a schematic view of a solar photovoltaic power generator connected to a power source meter and switch, and a utility grid.
Figure 4B:
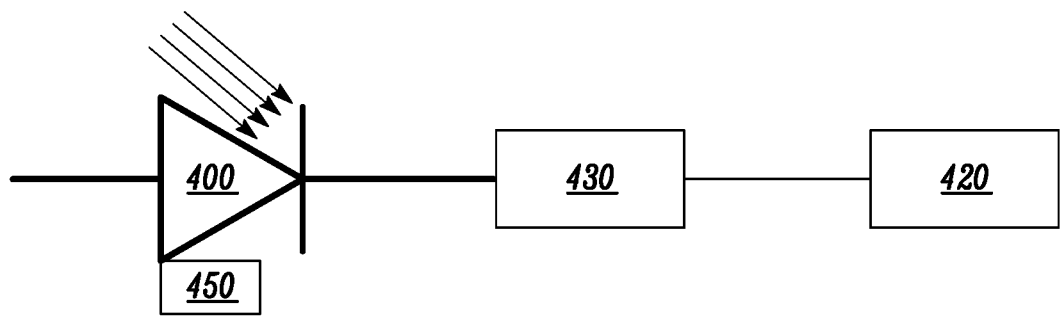
FIG. 4B is a schematic view of a solar photovoltaic power generator connected to an energy storage system and a utility grid.
Figure 4C:
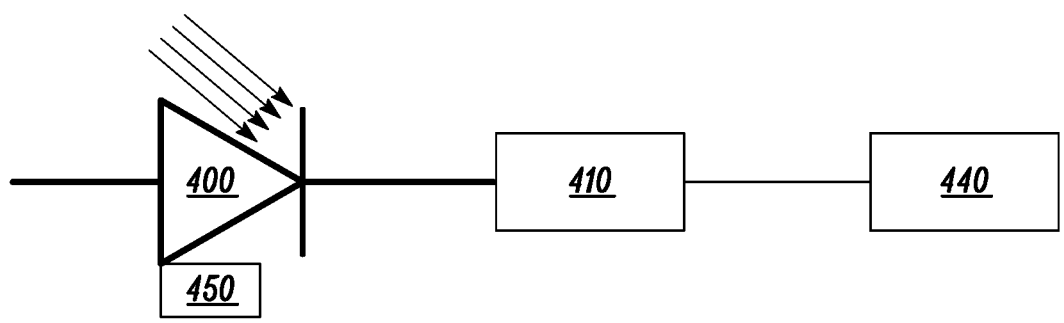
FIG. 4C is a schematic view of a solar photovoltaic power generator connected to a power source meter and switch, and a secondary power generator.

The system may deliver electrical power to an electrical utility grid 420, depicted schematically in FIG. 4A and FIG. 4B as an electrical utility conductor, through a generated power source meter and switch 410. The generated power delivery switch 410 is capable of controlling the amount of electrical power from the power source 400 delivered to the electrical utility grid 420. Some embodiments may also include a secondary power generator 440 to aid in a simulated grid connected system. The purpose of the secondary power generator is to supply grid frequency appropriate for the power source and switch 410.

Figure 5:
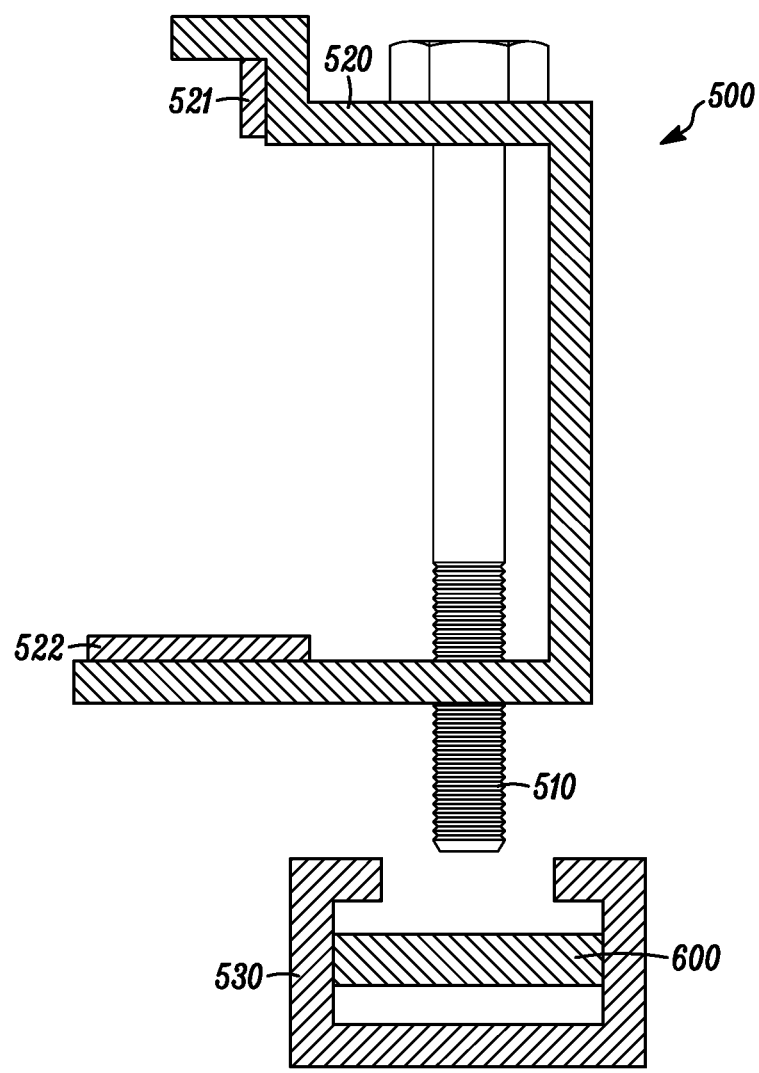
FIG. 5 is a schematic exploded view of a bracket attached to a strut, according to an example embodiment.

FIG. 5 is a schematic exploded view of a bracket or clip 500 attached to a strut, according to an example embodiment. In one embodiment, the plurality of clips or brackets 500 are C-shaped. The clips or brackets include a frame attachment end 510, and a solar panel attachment end 520. The solar panel attachment end 520 includes at least one cradling surface. The cradling surface may include an elastomeric surface for cradling the edge of a solar panel. As shown in FIG. 5, the clip or bracket 500 includes two cradling surfaces 521, 522. The frame attachment end 510 of the bracket is attachable to a T nut 600 for attaching to a strut 530 of the frame member 200, 300. The strut 530 is shown in cross-section in FIG. 5. T bolts are available from 80/20 Inc. at 1701 S. 400 E., Columbia City, Ind. 46725. T bolts come in drop-in, roll-in, and other types for engagement with the struts. 80/20 Inc. part number 13119 is a universal drop-in type T bolt.

Figure 6A:
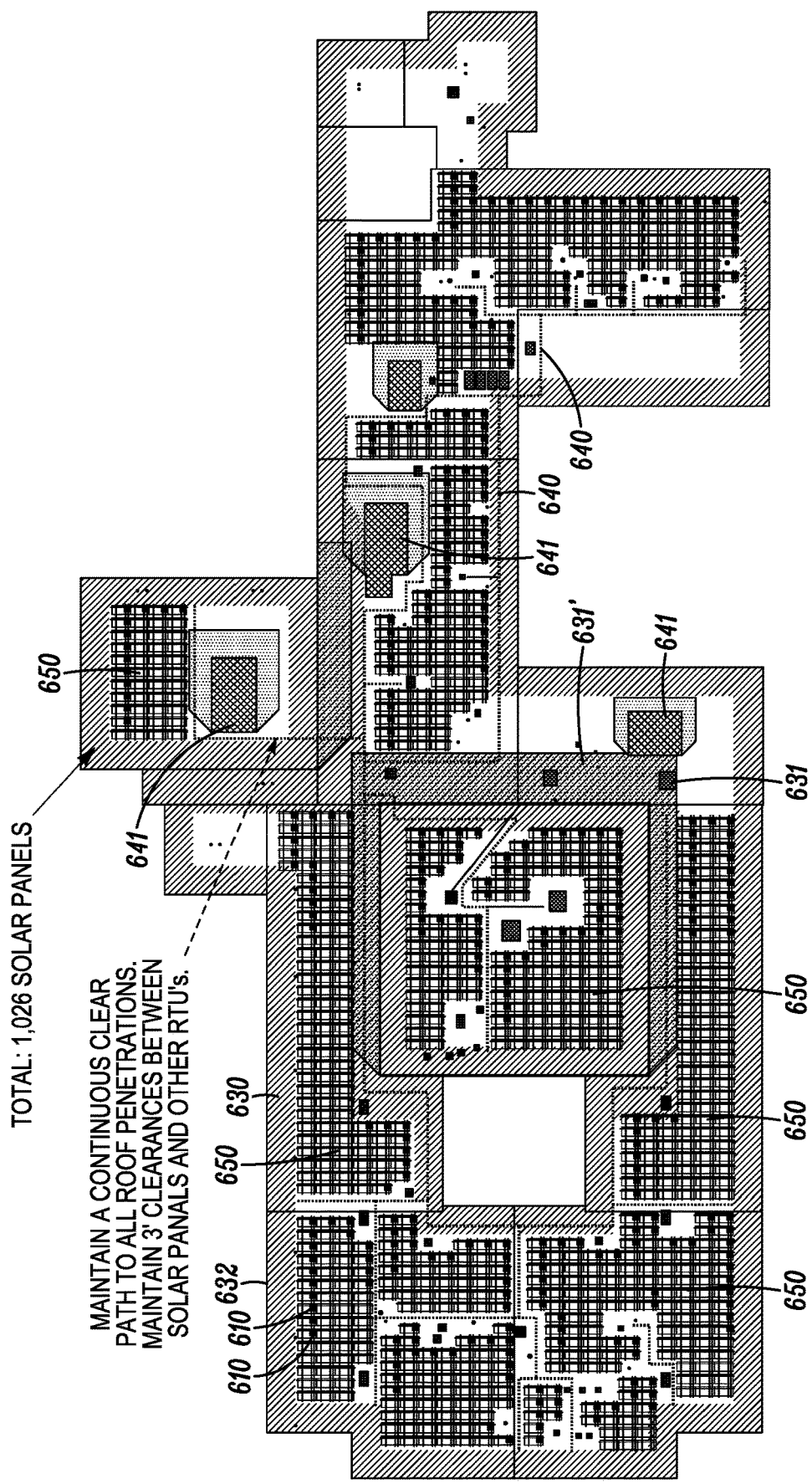
FIG. 6A is a schematic top view of a frame and solar panel layout on a flat roof of an edifice, according to an example embodiment.
Figure 6B:
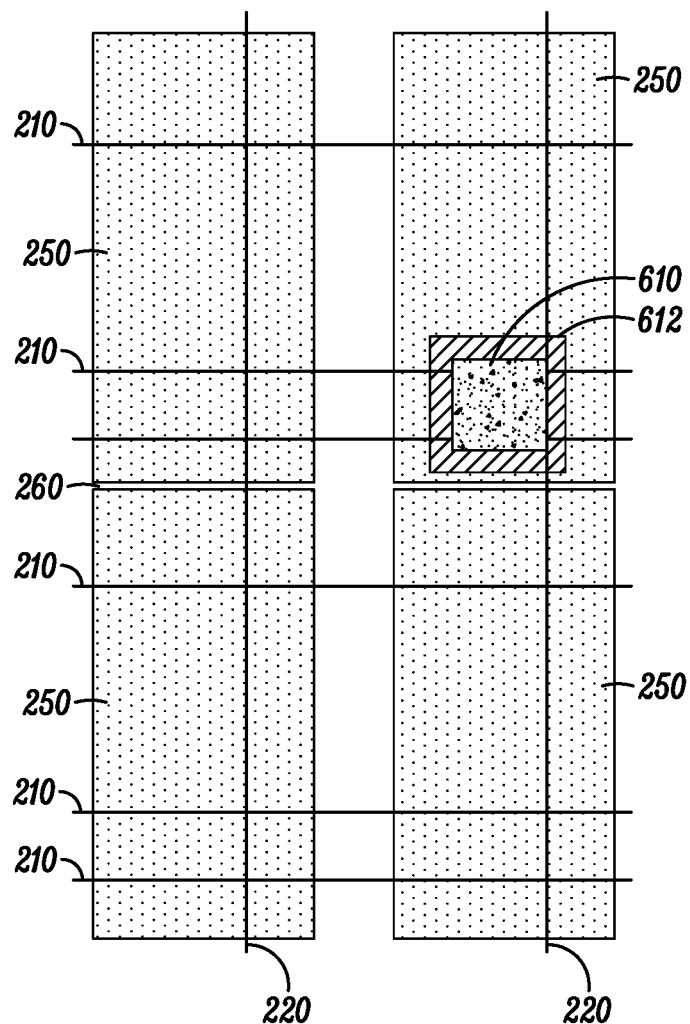
FIG. 6B is a portion of the schematic top view of a frame and solar panel layout on a flat roof of an edifice shown in FIG. 6A, according to an example embodiment.

FIG. 6A is a schematic top view of a frame and solar panel layout on a flat roof of an edifice, according to an example embodiment. FIG. 6B is a portion of the schematic top view of a frame and solar panel layout on a flat roof of an edifice shown in FIG. 6A, according to an example embodiment. Now referring to both FIGS. 6A and 6B, further aspects of the invention will be detailed. Turning first to FIG. 6A, the roof 630 of a building 632 is shown. FIG. 6 a is a schematic that shows a large installation of solar panels on the roof 630. The building 632 is relatively large and could be anything from my school, a factory, an office building, or the like. As shown, the roof 630 has various levels. For example, the roof portion 631 is elevated with respect to the majority of the roof surface depicted by 630. In this layout, the shadow 631' of roof portion 631 is shown in gray. No solar panels will be placed in the shadows, such as shadow 631'. Other elevated portions are also depicted on the roof 630 and have corresponding shadows. Of course, solar panels are generally not placed in the shadows since they will not produce energy or will produce energy at a very low rate while in a shadow. Other obstacles, such as rooftop units 641, are also shown as black boxes in FIG. 6A. These rooftop units 641 are various vents, rooftop air-conditioning units, and the like. Basically, these black boxes are not only rooftop units but are areas where the roof 630 is not flat. Pathways 640, shown as dotted lines, are also provided on the roof to all roof penetrations and obstacles and rooftop units 641 so that maintenance personnel can easily get to the obstacles or rooftop units. A minimum clearance is also maintained between these obstacles and rooftop units 641 and the rooftop solar units 650. For example, three-foot clearances are maintained between the solar panels on the roof 630 and all rooftop units 641 and other obstacles. The rooftop solar units 650 are made up of a multitude of individual solar panels which are placed on frames such as those discussed above with respect to FIGS. 2A, 2B, 2C, to 2D and 3. As shown in FIG. 6A, there are number of groupings of multiple solar units which includes the frame to which each of the solar units is attached. Each of the groupings has been given the same reference number 650. In installation, the frames and the solar units are grouped together as much as possible while still avoiding obstacles or rooftop units 641 on the roof, as well as shadows they may produce. When grouped together, the frames in attendance solar panels that are attached thereto are heavy enough so that a ballast unit is not required for each and every solar panel. FIG. 6A also shows a number of ballast units 610. The ballast units 610 are placed on the perimeter of a grouping of solar panels 650. More specifically the ballast units 610 are placed on the windward side of the perimeter of a grouping of solar panels. The rooftop solar units 650 which are laid out as shown in the above FIGS. 2A, 2B, 2C, 2D and 3 are very air permeable. In other words, air can pass through an array or large number of solar units without producing a large wind load on the grouping of solar units 650. This is advantageous in that less ballast is required in order to keep all of the solar unit 650 in contact with the surface of the roof 630. In other words, a smaller number of ballasts 610 are required to hold down a large group of solar units 650. This also reduces the load on the roof 630 and eases the installation of the various groupings of solar panels 650. It should be noted that in this particular installation there are a total of 1028 solar panels placed on the roof of this edifice 632.

Now turning to FIG. 6B, a ballast unit 610 includes concrete block 610 placed on a rubber pad 612. FIG. 6B is a portion of the schematic top view of a frame and solar panel layout 650 on a flat roof 630 of an edifice 632 shown in FIG. 6A. FIG. 6B shows for of the solar panels 250, from the array of 1028 solar panels on the roof 630 of the edifice 632. The ballast unit 610 is typically positioned under a solar panel 250 and over one or more struts 210. In many instances, the ballast unit 610 will abut or be positioned near a crossmember 220. Advantageously the ballast unit 610 is positioned beneath a solar panel 250. The solar panel 250 shades the ballast unit 610. Since the ballast unit 610 is shaded, the heat gain for the ballast unit 610 is reduced. Solar energy can be stored in a ballast unit 610 and is typically given off as heat after the sun goes down. Reducing the heat gain of the ballast unit also reduces the need to cool the inside of a building 832. When there are a number of ballast unit 610 on a roof 630, the heat produced can be significant so cutting this down by placing or hiding the ballast unit 610 under a solar panel 250 is an advantage. As discussed above the ballast units are only required on some of the edges of the network or array 650 of solar panels. The for each framing unit itself is relatively light. However, when a high number of framing units are networked together and bolted together, their resistance to wind loads and seismic loads is high due to this connectedness. This advantage is mainly achieved in a raise of solar panels having a minimum number of 25 to 50 solar panels 250 along with the associated frames for holding the solar panels 250.

In summary, mounting frames as described herein may refer to stand-alone frames or integrated components of solar photovoltaic power systems. A roof-mounted solar energy apparatus including a mounting frame having a plurality of struts positioned in a first direction, the plurality of struts substantially parallel to one another, and a plurality of cross-member struts positioned in a second position that is substantially perpendicular to the plurality of struts positioned in the first direction. The plurality of struts attached to the crossmember struts. The apparatus also including a bracket having an end for engaging a strut or a cross-member strut and dimensioned to hold a solar panel. The apparatus also includes a solar panel held by the plurality of brackets, some of which are attached to the struts and some of which were attached to the cross members. In one embodiment, the crossmembers are attached to the plurality of struts so that the solar panel forms an angle with respect to the plurality of struts positioned in the first position. In some embodiments, a stack of crossmembers attached to the plurality of struts, and the solar panel is attached to a stack of crossmembers to form an angle with respect to the plurality of struts positioned in the first position. The angle between the solar panel and the plurality of struts is increased by increasing the number of crossmembers in the stack of crossmembers. In some embodiments, the crossmembers in the stack of crossmembers is continuous between the plurality of struts. In other embodiments, the crossmembers in the stack of crossmembers is discontinuous between the plurality of struts. In one embodiment, the plurality of brackets are C-shaped. The brackets include a frame attachment end, and a solar panel attachment end. The solar panel attachment end includes a cradling surface. The cradling surface may include an elastomeric surface for cradling the edge of a solar panel. The frame attachment end of the bracket is attachable to a T nut for attaching to the frame member. In some embodiments, the frame formed carries at least two solar panels. The solar panels are attached to the frame so that there is a gap between the at least two solar panels.

Figure 7:
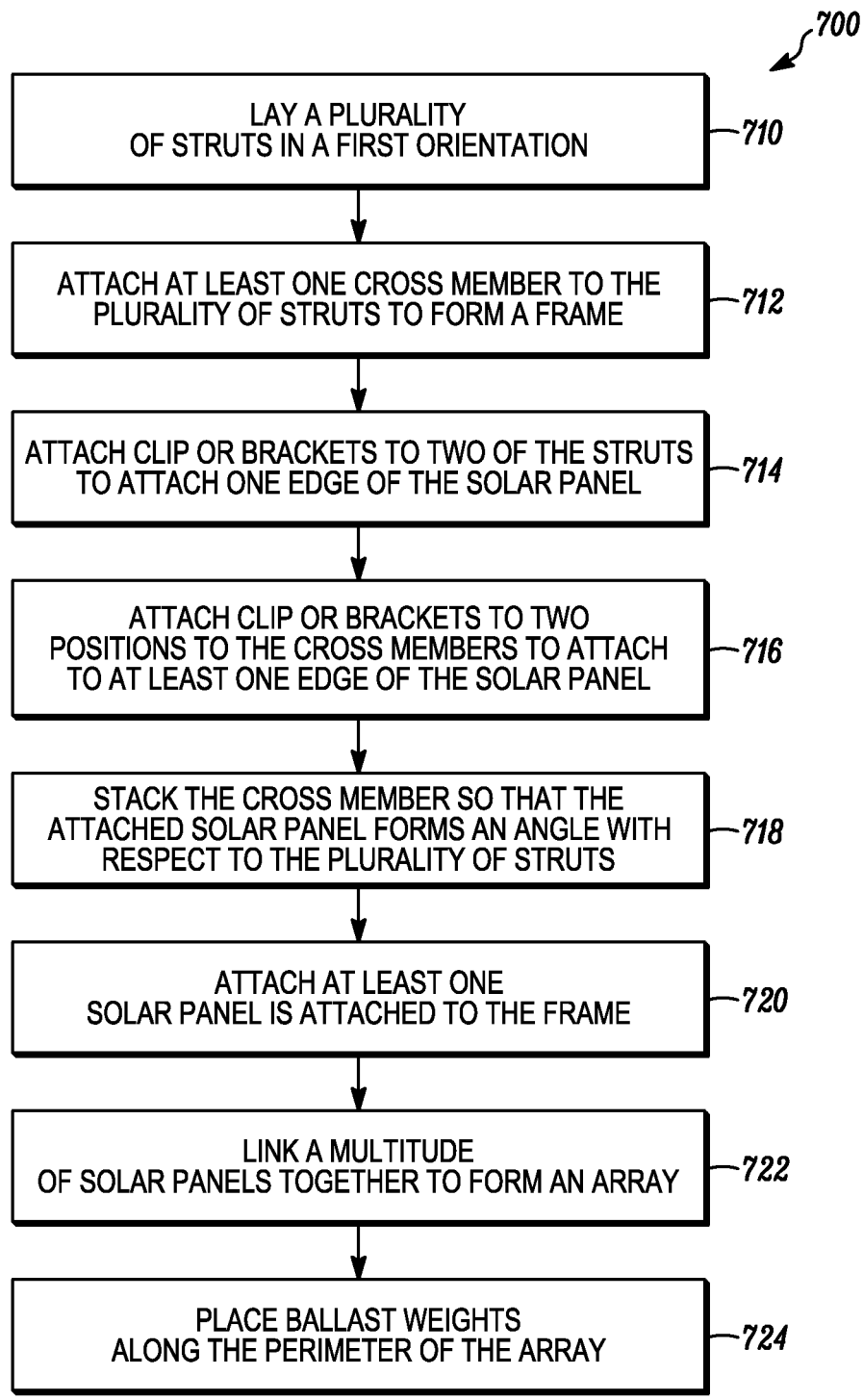
FIG. 7 is a flow chart of a method of forming a solar energy, according to an example embodiment.

A method 700 of forming a solar energy apparatus will now discussed with respect to FIG. 7, which is a flow chart of the method. The method 700 of forming a solar energy apparatus includes laying a plurality of struts in a first orientation 710, the plurality of struts being substantially parallel to one another, and attaching at least one crossmember to the plurality of struts 712 to form a frame. The cross member has a dimension at least equal to a dimension of the solar panel. The struts and crossmembers form a frame to which a solar panel is attached. The method further includes attaching clips or brackets to two of the struts to attach one edge of the solar panel 714 and attaching clips or brackets at two positions to the cross members to attach to at least one edge of the solar panel 716. In another embodiment, the method includes attaching another cross member to the plurality of struts and attaching clips or brackets to two crossmembers to attach to at least two or three edges of the solar panel. In one embodiment, the struts and the cross members have three continuous sides and a pair lips or catches on the fourth side. The clips or brackets are attached to the struts with a T bolt. In other embodiments, the cross members are stacked so that the attached solar panel forms an angle with respect to the plurality of struts 718. The angle formed is selected so that the solar panels are directed toward the sun. The number of stacked cross members can be seasonally adjusted to account for the seasonal declination of the sun. In some embodiments, the plurality of cross members is continuous, and in other embodiments, the plurality of cross members is discontinuous. At least one solar panel is attached to the frame 720. In some embodiments the method 700 further includes linking a multitude of solar panels together to form an array 722 and placing ballast weights along the perimeter of the array 724.

The invention claimed is:
1. A roof-mounted solar energy apparatus, comprising:
a mounting frame having a plurality of struts positioned in a first direction, wherein struts in the plurality of struts are substantially parallel to one another and further having a plurality of crossmembers positioned in a second direction that is substantially perpendicular to the plurality of struts positioned in the first direction;

a plurality of brackets, each having an end for engaging a strut of the plurality of struts or a crossmember of the plurality of crossmembers and dimensioned to hold a solar panel; and a solar panel held to the mounting frame by the plurality of brackets, wherein a first portion of the plurality of brackets is attached by a fastener solely to the solar panel and the plurality of struts and a second portion of the plurality of brackets is attached by a fastener solely to the solar panel and the plurality of crossmembers.

2. The apparatus of claim 1, the plurality of crossmembers is attached to the plurality of struts such that the solar panel forms an angle with respect to the plurality of struts positioned in the first direction.

3. The apparatus of claim 1, wherein the plurality of crossmembers attached to the plurality of struts are arranged in a stack of crossmembers one atop another and wherein the solar panel attached to the stack of crossmembers forms an angle with respect to the plurality of struts positioned in the first direction.

4. The apparatus of claim 3, wherein the angle between the solar panel and the plurality of struts is determined by a number of crossmembers in the stack of crossmembers.

5. The apparatus of claim 3, wherein the stack of crossmembers is continuous between the plurality of struts.

6. The apparatus of claim 3, wherein the stack of crossmembers is discontinuous between the plurality of struts.

7. The apparatus of claim 1, wherein the plurality of brackets is C-shaped and wherein the plurality of brackets comprises:

a frame attachment end; and a solar panel attachment end.

8. The apparatus of claim 7, wherein the plurality of brackets comprises:

a cradling surface that includes an elastomeric surface configured to cradle an edge of a solar panel.

9. The apparatus of claim 7, wherein the frame attachment end includes a T nut for attaching to the mounting frame.

10. The apparatus of claim 1, wherein the mounting frame holds at least two solar panels, wherein the solar panels arranged within the mounting frame so that there is a gap between the at least two solar panels.

11. A method of forming a solar energy apparatus, comprising:

laying a plurality of struts in a first orientation, the plurality of struts being substantially parallel to one another;

attaching a first crossmember to the plurality of struts to form a frame, wherein the crossmember has a dimension at least equal to a dimension of a solar panel;

attaching the solar panel to the frame using a first plurality of clips attached solely to the plurality of struts and a second plurality of clips attached solely to the first crossmember;

attaching the first plurality of clips to two struts in the plurality of struts to attach one edge of the solar panel; and attaching the second plurality of clips to the first crossmember to attach to at least one edge of the solar panel to the frame.

12. The method of claim 11, further comprising:

attaching a second crossmember to two other struts in the plurality of struts; and attaching a third plurality of clips to the second crossmember to attach at least two edges of the solar panel to the frame.

13. The method of claim 11, further comprising:

attaching a second crossmember to two other struts in the plurality of struts; and attaching the second plurality of clips to the first crossmember and a third plurality of clips to the second crossmember to attach at least three edges of the solar panel to the frame.

14. The method of claim 11, wherein the plurality of struts and the first crossmember have a rectangular cross section with three continuous sides and an open fourth side defining a pair of lips or catches and wherein the clips are attached to the plurality of struts with a T bolt.

15. A method of forming a solar energy apparatus, comprising:

laying a plurality of struts in a first orientation, the plurality of struts being substantially parallel to one another;

attaching a first crossmember to the plurality of struts to form a frame, wherein the crossmember has a dimension at least equal to a dimension of a solar panel;

attaching the solar panel to the frame using a first plurality of clips attached solely to the plurality of struts and a second plurality of clips attached solely to the first crossmember; and stacking a second crossmember on top of the first crossmember so that the attached solar panel forms an angle with respect to the plurality of struts.

16. The method of claim 15, further comprising:

selecting the angle by stacking a plurality of crossmembers including the first and second crossbars one atop another so that the solar panel is directed toward the sun.

17. The method of claim 16, wherein a number of crossmembers in the plurality of crossmembers are seasonally adjusted to change the angle to account for a seasonal declination of the sun.

18. The method of claim 15, wherein the first and second crossmembers are continuous.

19. The method of claim 15, wherein the first and second crossmembers are discontinuous.

20. The method of claim 15, further comprising:

forming a frame that holds a plurality of solar panels to form an array of solar panels; and placing ballast weights near a perimeter of the array of solar panels.

21. The method of claim 20, wherein placing ballast weights near the perimeter of the array of solar panels includes positioning the ballast weights below a portion of solar panels of the array of solar panels.

* * * * *